US011067605B2

(12) United States Patent
Nagendran et al.

(10) Patent No.: US 11,067,605 B2
(45) Date of Patent: Jul. 20, 2021

(54) INDUSTRIAL WIRELESS MULTIMETER FOR EASY DEPLOYMENT, TROUBLESHOOTING, AND MAINTENANCE

(71) Applicant: Honeywell International Inc., Morris Plains, NJ (US)

(72) Inventors: Yuvaraj Nagendran, Virudhunagar (IN); Prasad Samudrala, Bangalore (IN); Thejaswini Chandrashekar, Bengaluru (IN); Mario Benjamin Dias, Leeming (AU); Amol Gandhi, Bangalore (IN)

(73) Assignee: Honeywell International Inc, Charlotte, NC (US)

( * ) Notice: Subject to any disclaimer, the term of this patent is extended or adjusted under 35 U.S.C. 154(b) by 291 days.

(21) Appl. No.: 15/934,529

(22) Filed: Mar. 23, 2018

(65) Prior Publication Data

US 2019/0293687 A1   Sep. 26, 2019

(51) Int. Cl.
| | |
|---|---|
| *G01R 15/12* | (2006.01) |
| *H04W 8/00* | (2009.01) |
| *G06F 1/16* | (2006.01) |
| *G06K 17/00* | (2006.01) |

(52) U.S. Cl.
CPC ......... *G01R 15/125* (2013.01); *G06F 1/1698* (2013.01); *H04W 8/005* (2013.01); *G06K 17/0022* (2013.01)

(58) Field of Classification Search
None
See application file for complete search history.

(56) References Cited

U.S. PATENT DOCUMENTS

| | | | |
|---|---|---|---|
| 8,406,220 B2 | 3/2013 | McLaughlin et al. | |
| 9,065,813 B2 | 6/2015 | Kolavennu et al. | |
| 9,405,285 B2 | 8/2016 | Powell et al. | |
| 2012/0236768 A1* | 9/2012 | Kolavennu | H04L 69/08 370/310 |
| 2014/0036712 A1 | 2/2014 | Dewey et al. | |

(Continued)

FOREIGN PATENT DOCUMENTS

WO   2016107981 A1   7/2016

OTHER PUBLICATIONS

Emerson Process Management, "475 Field Communicator," Product Data Sheet, May 2013, 8 pages.

(Continued)

*Primary Examiner* — Cai Y Chen
(74) *Attorney, Agent, or Firm* — Paschall & Associates, LLC; Anthony Miologos

(57) ABSTRACT

An apparatus includes a tablet computing device and a radio module physically fastened to the tablet computing device. The tablet computing device has a display and is configured to establish WiFi and BLUETOOTH Low Energy (BLE) communication links with other devices. The radio module is configured to establish ISA100 and WirelessHART communication links with field devices of a process control and automation system. The tablet computing device and the radio module are configured to communicate with each other using a BLE communication link. The apparatus is configured to selectably operate in multiple modes comprising a gateway mode, a router mode, a sniffer mode, and a discovery mode.

17 Claims, 8 Drawing Sheets

(56) References Cited

U.S. PATENT DOCUMENTS

| | | |
|---|---|---|
| 2014/0369212 A1 | 12/2014 | Raravi et al. |
| 2015/0276432 A1 | 10/2015 | Repyevsky et al. |
| 2017/0131222 A1* | 5/2017 | Zalbide Agirrezabalaga .............. G01D 4/002 |
| 2017/0208364 A1* | 7/2017 | Glazier ............ H04N 21/41407 |
| 2017/0359675 A1 | 12/2017 | Gopalakrishnan et al. |
| 2018/0088646 A1 | 3/2018 | Chen et al. |
| 2018/0113602 A1* | 4/2018 | Gopalakrishnan ...... H04W 4/80 |

OTHER PUBLICATIONS

Honeywell International Inc., "Using Honeywell's Field Device Configurator for Simple and Efficient Instrument Maintenance," Aug. 2011.

\* cited by examiner

INDUSTRIAL WIRELESS MULTIMETER FOR EASY DEPLOYMENT, TROUBLESHOOTING, AND MAINTENANCE

TECHNICAL FIELD

This disclosure relates generally to industrial control systems. More specifically, this disclosure relates to an industrial wireless multimeter for easy deployment, site survey, troubleshooting, and maintenance of an industrial field wireless network in an industrial control system.

BACKGROUND

Industrial process control and automation systems are often used to automate large and complex industrial processes, such as those in the chemical industry. These types of systems routinely include sensors, actuators, and controllers. The controllers typically receive measurements from the sensors and generate control signals for the actuators.

Such sensors and actuators comprise a group of devices commonly referred to field devices or field instruments. In production environments, field devices often need to be accessed by a field technician to perform calibration, diagnostics, or other maintenance activities. In many cases, the field devices are deployed, configured, or maintained using handheld devices.

SUMMARY

This disclosure provides an industrial wireless multimeter for easy deployment, site survey, troubleshooting, and maintenance of a wireless network in an industrial control system, and a method for use thereof.

An industrial wireless field network can include wireless transmitters with two standard industrial wireless protocols (ISA100 and WirelessHART). To troubleshoot and deploy these transmitters in the field, a handheld device that understanding these two wireless protocols helps a field technician to quickly deploy and troubleshoot an industrial wireless field network.

In a first embodiment, an apparatus includes a tablet computing device and a radio module physically fastened to the tablet computing device. The tablet computing device has a display and is configured to establish WiFi and BLUETOOTH Low Energy (BLE) communication links with other devices. The radio module is configured to establish ISA100 and WirelessHART communication links with field devices of a process control and automation system. The tablet computing device and the radio module are configured to communicate with each other using a BLE communication link. The apparatus is configured to selectably operate in multiple modes comprising a gateway mode, a router mode, a sniffer mode, and a discovery mode.

In a second embodiment, a method includes communicating between a tablet computing device and a radio module of an apparatus using a BLE communication link. The method also includes selectably operating, by the apparatus, in multiple modes comprising a gateway mode, a router mode, a sniffer mode, and a discovery mode. The method further includes displaying information on a display of the tablet computing device. The tablet computing device is configured to establish WiFi and BLE communication links with other devices. The radio module is physically fastened to the tablet computing device and is configured to establish ISA100 and WirelessHART communication links with field devices of a process control and automation system.

In a third embodiment, a non-transitory computer readable medium contains instructions that, when executed by at least one processing device, cause the at least one processing device to control a tablet computing device and a radio module of an apparatus to communicate using a BLE communication link. The medium also contains instructions that, when executed by the at least one processing device, cause the at least one processing device to selectably operate the apparatus in multiple modes comprising a gateway mode, a router mode, a sniffer mode, and a discovery mode. The medium further contains instructions that, when executed by the at least one processing device, cause the at least one processing device to display information on a display of the tablet computing device. The tablet computing device is configured to establish WiFi and BLE communication links with other devices. The radio module is physically fastened to the tablet computing device and is configured to establish ISA100 and WirelessHART communication links with field devices of a process control and automation system.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

The figures discussed below and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
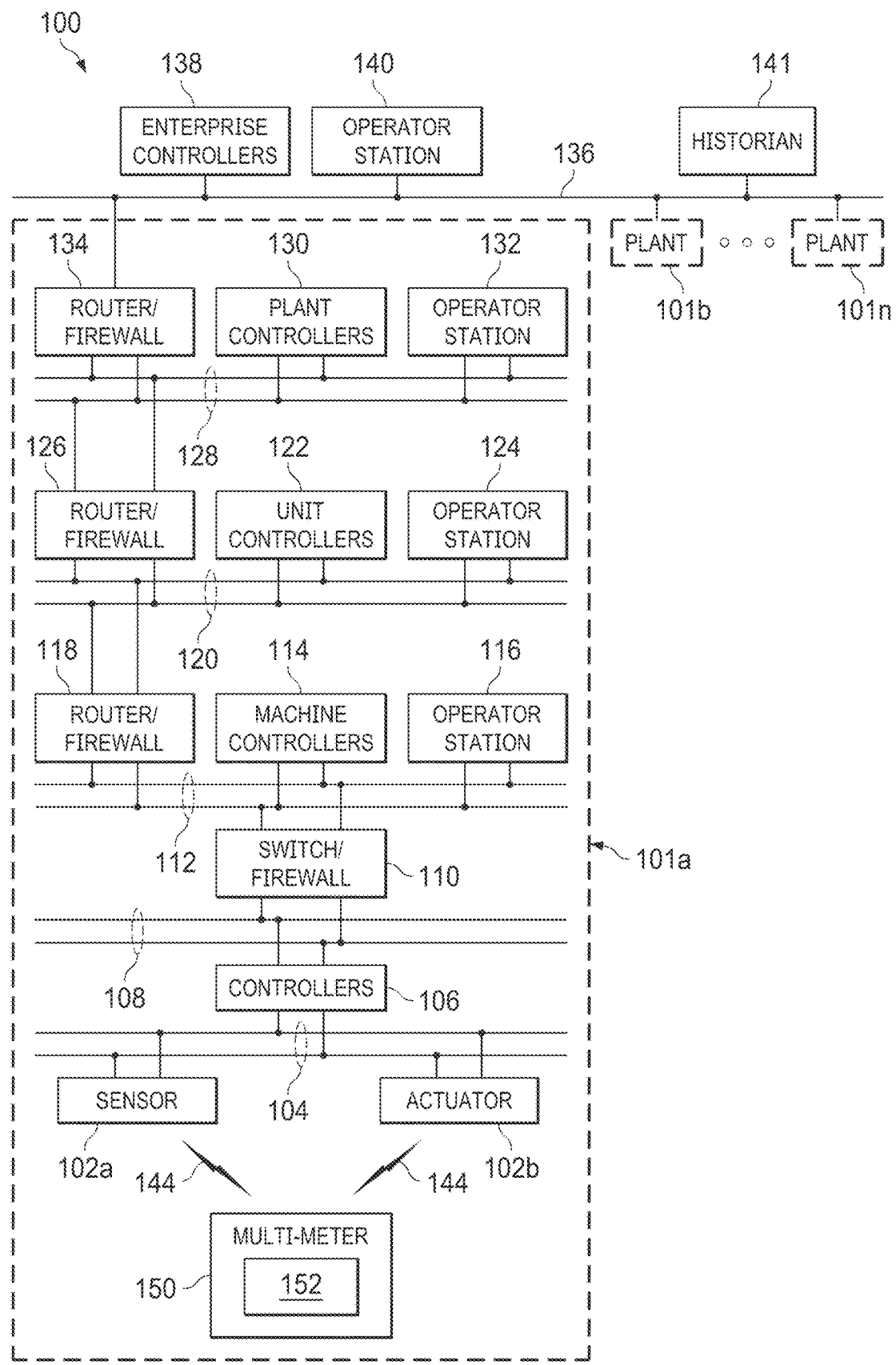
FIG. 1 illustrates an example industrial process control and automation system according to this disclosure.

FIG. 1 illustrates an example industrial process control and automation system 100 according to this disclosure. As shown in FIG. 1, the system 100 includes various components that facilitate production or processing of at least one product or other material. For instance, the system 100 is used here to facilitate control over components in one or multiple plants 101a-101n. Each plant 101a-101n represents one or more processing facilities (or one or more portions thereof), such as one or more manufacturing facilities for producing at least one product or other material. In general, each plant 101a-101n may implement one or more processes and can individually or collectively be referred to as a process system. A process system generally represents any system or portion thereof configured to process one or more products or other materials in some manner.

In FIG. 1, the system 100 is implemented using the Purdue model of process control. In the Purdue model, "Level 0" may include one or more sensors 102a and one or more actuators 102b (also collectively referred to as field devices 102). The sensors 102a and actuators 102b represent components in a process system that may perform any of a wide variety of functions. For example, the sensors 102a could measure a wide variety of characteristics in the process system, such as temperature, pressure, or flow rate. Also, the actuators 102b could alter a wide variety of characteristics in the process system. The sensors 102a and actuators 102b could represent any other or additional components in any suitable process system. Each of the sensors 102a includes any suitable structure for measuring one or more characteristics in a process system. Each of the actuators 102b includes any suitable structure for operating on or affecting one or more conditions in a process system.

At least one network 104 is coupled to the sensors 102a and actuators 102b. The network 104 facilitates interaction with the sensors 102a and actuators 102b. For example, the network 104 could transport measurement data from the sensors 102a and provide control signals to the actuators 102b. The network 104 could represent any suitable network or combination of networks. As particular examples, the network 104 could represent an Ethernet network, an electrical signal network (such as a HART or FOUNDATION FIELDBUS network), a pneumatic control signal network, or any other or additional type(s) of network(s).

In the Purdue model, "Level 1" may include one or more controllers 106, which are coupled to the network 104. Among other things, each controller 106 may use the measurements from one or more sensors 102a to control the operation of one or more actuators 102b. For example, a controller 106 could receive measurement data from one or more sensors 102a and use the measurement data to generate control signals for one or more actuators 102b. Multiple controllers 106 could also operate in redundant configurations, such as when one controller 106 operates as a primary controller while another controller 106 operates as a backup controller (which synchronizes with the primary controller and can take over for the primary controller in the event of a fault with the primary controller). Each controller 106 includes any suitable structure for interacting with one or more sensors 102a and controlling one or more actuators 102b. Each controller 106 could, for example, represent a multivariable controller, such as a Robust Multivariable Predictive Control Technology (RMPCT) controller or other type of controller implementing model predictive control (MPC) or other advanced predictive control (APC). As a particular example, each controller 106 could represent a computing device running a real-time operating system.

Two networks 108 are coupled to the controllers 106. The networks 108 facilitate interaction with the controllers 106, such as by transporting data to and from the controllers 106. The networks 108 could represent any suitable networks or combination of networks. As particular examples, the networks 108 could represent a pair of Ethernet networks or a redundant pair of Ethernet networks, such as a FAULT TOLERANT ETHERNET (FTE) network from HONEYWELL INTERNATIONAL INC.

At least one switch/firewall 110 couples the networks 108 to two networks 112. The switch/firewall 110 may transport traffic from one network to another. The switch/firewall 110 may also block traffic on one network from reaching another network. The switch/firewall 110 includes any suitable structure for providing communication between networks, such as a HONEYWELL CONTROL FIREWALL (CF9) device. The networks 112 could represent any suitable networks, such as a pair of Ethernet networks or an FTE network.

In the Purdue model, "Level 2" may include one or more machine-level controllers 114 coupled to the networks 112. The machine-level controllers 114 perform various supervisory functions to support the operation and control of the controllers 106, sensors 102a, and actuators 102b, which could be associated with a particular piece of industrial equipment (such as a boiler or other machine). For example, the machine-level controllers 114 could log information collected or generated by the controllers 106, such as measurement data from the sensors 102a or control signals for the actuators 102b. The machine-level controllers 114 could also execute applications that control the operation of the controllers 106, thereby controlling the operation of the actuators 102b. In addition, the machine-level controllers 114 could provide secure access to the controllers 106. Each of the machine-level controllers 114 includes any suitable structure for providing access to, control of, or operations related to a machine or other individual piece of equipment. Each of the machine-level controllers 114 could, for example, represent a server computing device running a MICROSOFT WINDOWS operating system. Additionally or alternatively, each controller 114 could represent a multivariable controller embedded in a Distributed Control System (DCS), such as a RMPCT controller or other type of controller implementing MPC or other APC. Although not shown, different machine-level controllers 114 could be used to control different pieces of equipment in a process system (where each piece of equipment is associated with one or more controllers 106, sensors 102a, and actuators 102b).

One or more operator stations 116 are coupled to the networks 112. The operator stations 116 represent computing or communication devices providing user access to the machine-level controllers 114, which could then provide user access to the controllers 106 (and possibly the sensors 102a and actuators 102b). As particular examples, the operator stations 116 could allow users to review the operational history of the sensors 102a and actuators 102b using information collected by the controllers 106 and/or the machine-level controllers 114. The operator stations 116 could also allow the users to adjust the operation of the sensors 102a, actuators 102b, controllers 106, or machine-level controllers 114. In addition, the operator stations 116 could receive and display warnings, alerts, or other messages or displays generated by the controllers 106 or the machine-level controllers 114. Each of the operator stations 116 includes any suitable structure for supporting user access and control of one or more components in the system 100. Each of the operator stations 116 could, for example, represent a computing device running a MICROSOFT WINDOWS operating system.

At least one router/firewall 118 couples the networks 112 to two networks 120. The router/firewall 118 includes any suitable structure for providing communication between networks, such as a secure router or combination router/firewall. The networks 120 could represent any suitable networks, such as a pair of Ethernet networks or an FTE network.

In the Purdue model, "Level 3" may include one or more unit-level controllers 122 coupled to the networks 120. Each unit-level controller 122 is typically associated with a unit in a process system, which represents a collection of different machines operating together to implement at least part of a process. The unit-level controllers 122 perform various functions to support the operation and control of components in the lower levels. For example, the unit-level controllers 122 could log information collected or generated by the components in the lower levels, execute applications that control the components in the lower levels, and provide secure access to the components in the lower levels. Each of the unit-level controllers 122 includes any suitable structure for providing access to, control of, or operations related to one or more machines or other pieces of equipment in a process unit. Each of the unit-level controllers 122 could, for example, represent a server computing device running a MICROSOFT WINDOWS operating system. Additionally or alternatively, each controller 122 could represent a multivariable controller, such as a HONEYWELL C300 controller. Although not shown, different unit-level controllers 122 could be used to control different units in a process system (where each unit is associated with one or more machine-level controllers 114, controllers 106, sensors 102*a*, and actuators 102*b*).

Access to the unit-level controllers 122 may be provided by one or more operator stations 124. Each of the operator stations 124 includes any suitable structure for supporting user access and control of one or more components in the system 100. Each of the operator stations 124 could, for example, represent a computing device running a MICROSOFT WINDOWS operating system.

At least one router/firewall 126 couples the networks 120 to two networks 128. The router/firewall 126 includes any suitable structure for providing communication between networks, such as a secure router or combination router/firewall. The networks 128 could represent any suitable networks, such as a pair of Ethernet networks or an FTE network.

In the Purdue model, "Level 4" may include one or more plant-level controllers 130 coupled to the networks 128. Each plant-level controller 130 is typically associated with one of the plants 101*a*-101*n*, which may include one or more process units that implement the same, similar, or different processes. The plant-level controllers 130 perform various functions to support the operation and control of components in the lower levels. As particular examples, the plant-level controller 130 could execute one or more manufacturing execution system (MES) applications, scheduling applications, or other or additional plant or process control applications. Each of the plant-level controllers 130 includes any suitable structure for providing access to, control of, or operations related to one or more process units in a process plant. Each of the plant-level controllers 130 could, for example, represent a server computing device running a MICROSOFT WINDOWS operating system.

Access to the plant-level controllers 130 may be provided by one or more operator stations 132. Each of the operator stations 132 includes any suitable structure for supporting user access and control of one or more components in the system 100. Each of the operator stations 132 could, for example, represent a computing device running a MICROSOFT WINDOWS operating system.

At least one router/firewall 134 couples the networks 128 to one or more networks 136. The router/firewall 134 includes any suitable structure for providing communication between networks, such as a secure router or combination router/firewall. The network 136 could represent any suitable network, such as an enterprise-wide Ethernet or other network or all or a portion of a larger network (such as the Internet).

In the Purdue model, "Level 5" may include one or more enterprise-level controllers 138 coupled to the network 136. Each enterprise-level controller 138 is typically able to perform planning operations for multiple plants 101*a*-101*n* and to control various aspects of the plants 101*a*-101*n*. The enterprise-level controllers 138 can also perform various functions to support the operation and control of components in the plants 101*a*-101*n*. As particular examples, the enterprise-level controller 138 could execute one or more order processing applications, enterprise resource planning (ERP) applications, advanced planning and scheduling (APS) applications, or any other or additional enterprise control applications. Each of the enterprise-level controllers 138 includes any suitable structure for providing access to, control of, or operations related to the control of one or more plants. Each of the enterprise-level controllers 138 could, for example, represent a server computing device running a MICROSOFT WINDOWS operating system. In this document, the term "enterprise" refers to an organization having one or more plants or other processing facilities to be managed. Note that if a single plant 101*a* is to be managed, the functionality of the enterprise-level controller 138 could be incorporated into the plant-level controller 130.

Access to the enterprise-level controllers 138 may be provided by one or more operator stations 140. Each of the operator stations 140 includes any suitable structure for supporting user access and control of one or more components in the system 100. Each of the operator stations 140 could, for example, represent a computing device running a MICROSOFT WINDOWS operating system.

Various levels of the Purdue model can include other components, such as one or more databases. The database(s) associated with each level could store any suitable information associated with that level or one or more other levels of the system 100. For example, a historian 141 can be coupled to the network 136. The historian 141 could represent a component that stores various information about the system 100. The historian 141 could, for instance, store information used during production scheduling and optimization. The historian 141 represents any suitable structure for storing and facilitating retrieval of information. Although shown as a single centralized component coupled to the network 136, the historian 141 could be located elsewhere in the system 100, or multiple historians could be distributed in different locations in the system 100.

In particular embodiments, the various controllers and operator stations in FIG. 1 may represent computing devices. For example, each of the controllers and operator stations could include one or more processing devices and one or more memories for storing instructions and data used, generated, or collected by the processing device(s). Each of the controllers and operator stations could also include at least one network interface, such as one or more Ethernet interfaces or wireless transceivers.

In industrial process control and automation systems such as the system 100, an industrial field wireless network is typically installed only after a complete site survey is performed to uncover any wireless coverage blockages, wireless signal fading, multipath reflections, and the like. Wireless deployment site surveys are performed by transporting multiple site surveying hardware components to the site, including solution components like a wireless device manager (WDM), multiple wireless access points (APs), and multiple wireless field devices. The components are installed in a location and signal strengths are checked in the WDM once they join the network. If the signal strength is poor, then the AP locations are adjusted to ensure the field devices have good signal strength. Once this is done, the technicians move the surveying equipment to the next site location and repeat the process. This process is very time consuming and can take more than thirty days, or even sixty days in large installations. Moving from one site location to a different location is a tedious job because: (1) equipment like WDMs, APs, and field devices are all heavy, and (2) WDMs and APs need power to operate. As a result, it can be very costly to complete the site survey.

In typical WiFi site surveys, there are many standard tools in the market to perform the site survey, but WiFi site survey tools do not detect industrial wireless field networks and narrow band wireless networks operating in the same WiFi operating ISM frequency bands. Performing a WiFi based site survey may not help for narrow band industrial wireless field network installations since the characteristics of both these networks are different. Industrial wireless field networks like ISA100 and WirelessHART are narrow band frequency hopping devices with higher receiver sensitivity and communication over longer distances compared to WiFi devices. So these networks require special site survey and deployment tools to achieve a proper site survey for industrial wireless networks installation.

In addition, technicians often have to add new field devices to an existing wireless network. In this situation, technicians carry the heavy field devices to the intended location and provision each field device, if the device is visible on the WDM interface. Once a field device is provisioned, the technician may find out that the signal in the area is weak or not reliable. Often, the technician takes the device to the field, and waits for a long period of time only to find out that radio signal coverage is not available at the location. This is a very frustrating process if the field device does not find an AP with a good signal nearby, in order to join the network. In some cases, the technician may have no idea why the field device is not able to join the network. It may a device problem or it may be a signal problem, but the cause is not clear to the technician.

Furthermore, technicians often have to troubleshoot field device communication link failures. There are instances where one or more field devices in a particular area of a plant drop or do not form communication links with their neighbors, even though the neighbors are close by. Technicians cannot always easily determine the reason why the links between a set of field devices and a router or AP do not form. There could be many reasons for that, such as:

1. Substantial multipath signal fading in that direction.
2. Recent changes in the environment.
3. Obstructions from a temporary placement of large material in the path.
4. Substantial interference in one particular area causing wireless links not to form in that location.
5. A new wireless signal or system is introduced nearby that affects the network in question.

Thus, the technician may have no idea why the communication links are not forming or not working correctly. It could be a specific Router/FD/AP problem, an interference problem, or an environment change problem, but the cause is not clear to the technician.

Thus, there is a need for a better way to perform site surveys that reduces time and cost. Likewise, there is a need for a handheld device that, when provisioned on a network, can display essential wireless parameters, such as a list of active and inactive connections to field device access points (FDAPs), received signal strength indicator (RSSI) and received signal quality indicator (RSQI) of nearby routers, and the like.

To address these and other issues, embodiments of this disclosure provide an industrial wireless multimeter 150 for use by site technicians and capable of operating in multiple modes, including as an industrial wireless sniffer tool. The multimeter 150 is configured to help users with (i) setting up an industrial wireless network with less cost, less labor, and less effort, (ii) expanding existing industrial networks with ease by determining advantageous locations to mount access points and routers, and (iii) maintenance and troubleshooting of wireless network problems with less wireless expertise.

The multimeter 150 is configured to establish a wireless connection 144 and communicate with one or more components of the system 100, including the field devices 102 (e.g., the sensors 102a, the actuators 102b, or any other suitable field device(s)). The multimeter 150 and the field devices 102 can communicate over the wireless connection 144 using one or more of multiple communication protocols, including WirelessHART, ISA100, BLUETOOTH Low Energy (BLE), and any other suitable communication protocols. The multimeter 150 may store and execute one or more applications 152 for setting up, expanding, or troubleshooting industrial wireless networks. In some embodiments, the application(s) 152 are compatible with WirelessHART, and any other suitable communication protocols. Additional details regarding the multimeter 150 and the application(s) 152 are provided below.

Although FIG. 1 illustrates one example of an industrial process control and automation system 100, various changes may be made to FIG. 1. For example, a control system could include any number of sensors, actuators, controllers, servers, operator stations, networks, access points, and routers. Also, the makeup and arrangement of the system 100 in FIG. 1 is for illustration only. Components could be added, omitted, combined, or placed in any other suitable configuration according to particular needs. Further, particular functions have been described as being performed by particular components of the system 100. This is for illustration only. In general, process control systems are highly configurable and can be configured in any suitable manner according to particular needs.

Figure 2A:
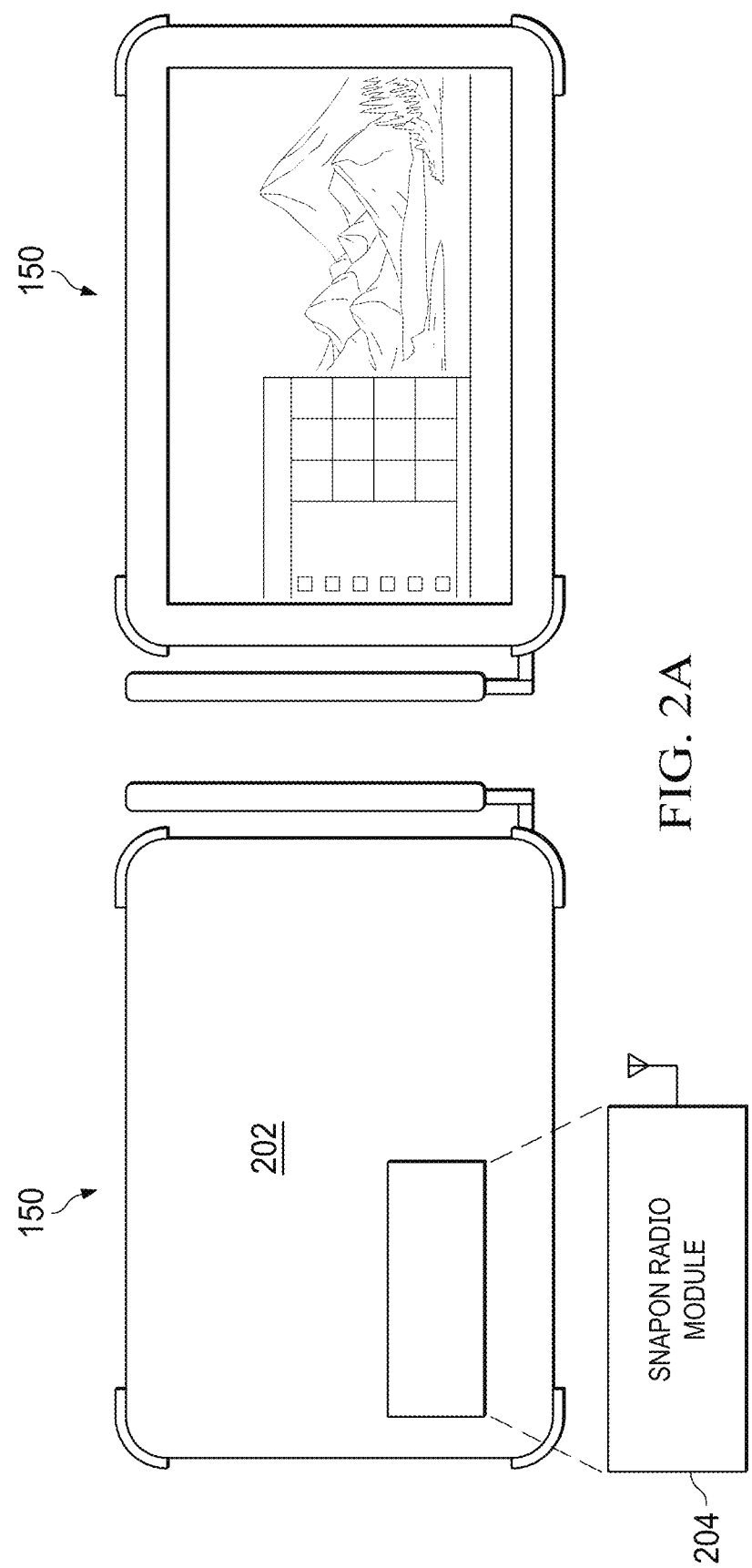
FIG. 2A illustrates back and front view of one example of a multimeter in the system of FIG. 1 according to this disclosure.
Figure 2B:
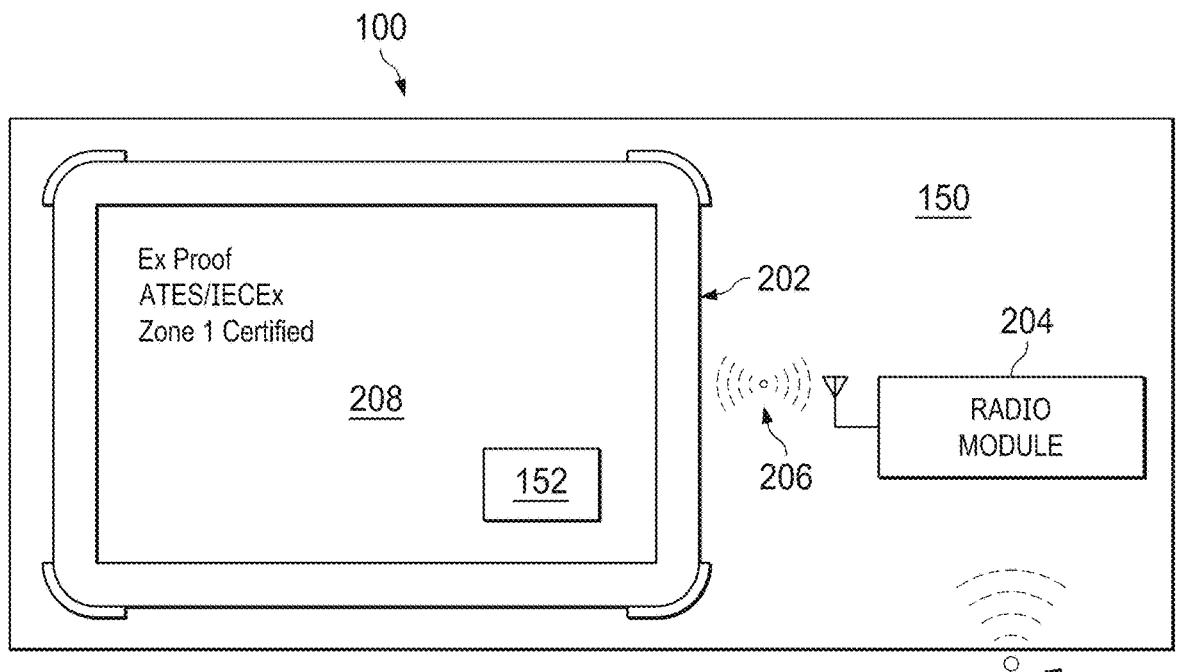
FIG. 2B illustrates a generalized example of a multimeter interacting with a field device in the system of FIG. 1 according to this disclosure.

FIGS. 2A and 2B illustrate additional details of the multimeter 150 according to this disclosure. FIG. 2A illustrates back and front views of one example of the multimeter 150. FIG. 2B illustrates a generalized example of the multimeter 150 interacting with a field device 102 in the system 100.

As shown in FIG. 2A, the multimeter 150 includes a tablet 202 and a BLE enabled radio module 204 that are integrated as one device. For example, in some embodiments, the BLE enabled radio module 204 can be securely fastened to a back side of the tablet 202. In other embodiments, the tablet 202 and the BLE enabled radio module 204 can be encased in a single housing. In some embodiments, the radio module 204 and the tablet 202 communicate with each other over a serial communication link that is securely connected to both devices.

The tablet 202 is a handheld tablet-style computing device. In some embodiments, the tablet 202 is a rugged industrial grade Explosion Proof Intrinsic Safe Zone 1 tablet. In other embodiments, the tablet 202 can be a standard or common tablet for personal use, a specialized tablet, or another computing device, such as a laptop or mobile phone. The tablet 202 is configured to store and execute the one or more applications 152. As known in the art, the tablet 202 includes a touch-sensitive display screen that allows for input and output of information with a user.

The BLE enabled radio module 204 is an industrial radio module, such as a HONEYWELL next-generation radio module named GenX Radio Module (GXRM), that includes at least one antenna and at least one transceiver. The BLE enabled radio module 204 is configured for communication using multiple protocols, including BLE, ISA100, WirelessHART, or any combination of these. In some embodiments, the BLE enabled radio module 204 is a small (e.g., approximately 4 inches×4 inches×2 inches) radio device configured to support radio communications in accordance with IEEE 802.15.4 standards. In some embodiments, the BLE enabled radio module 204 can concurrently execute ISA100, WirelessHART, and BLE 4.2 software stacks.

In operation, the BLE enabled radio module 204 communicates with the tablet 202 using the BLE protocol, and communicates with field devices, access points, or routers using the ISA100 or WirelessHART protocol. The BLE enabled radio module 204 is configured to operate in different modes according to the application(s) 152 executing on the tablet 202. For example, as shown in FIG. 2B, the tablet 202 can execute an application 152, which communicates to and configures the BLE enabled radio module 204 using a BLE communication link 206. The BLE enabled radio module 204 receives data from one or more devices (e.g., a field device 102) using the wireless connection 144, and sends the data over the BLE communication link 206 to the tablet 202, which configures the data into a presentable format, and presents to the user on the touchscreen 208.

The multimeter 150 can perform multiple operations associated with site surveys and site maintenance, depending on the executing application 152 and the user objective. For example, the multimeter 150 can (i) create a ISA100 or WirelessHART gateway, (ii) sniff network messages, such as ISA100, WirelessHART, or ZigBee network messages, and (iii) communicate with industrial grade handheld devices that support BLUETOOTH. In some embodiments, the multimeter 150 supports at least four different modes:

Gateway Mode→The multimeter 150 creates a new ISA100 or WirelessHART gateway (e.g., for a new network), advertises ISA100 or WirelessHART advertisements, accepts joining devices, and displays the discovered devices on the touchscreen 208, along with corresponding signal strengths.

Router mode→The multimeter 150 joins in any installed ISA100 or WirelessHART network as a battery powered field router, and shows RSSI values of other routers nearby.

Sniffer mode→The multimeter 150 sniffs for existing installed 802.15.4 networks, and displays any installed ISA100, WirelessHART, ZigBee or other 802.15.4 network present in that location, along with the network ID, signal strength of the network, and other network information. The multimeter 150 also sniffs existing WiFi networks using the WiFi radio on the tablet 202.

Discovery mode→The multimeter 150 does not join a network, but listens for particular ISA100 or WirelessHART network packets, and lists all devices that are visible to the multimeter 150, along with the corresponding RSSI or RSQI. This discovery is performed by listening for a predetermined period time on all 802.15.4 channels for a particular network.

Further details of each operating mode will now be provided.

Figure 3:
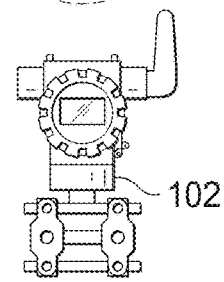
FIG. 3 illustrates an example of a multimeter operating as a gateway according to this disclosure.
Figure 3:
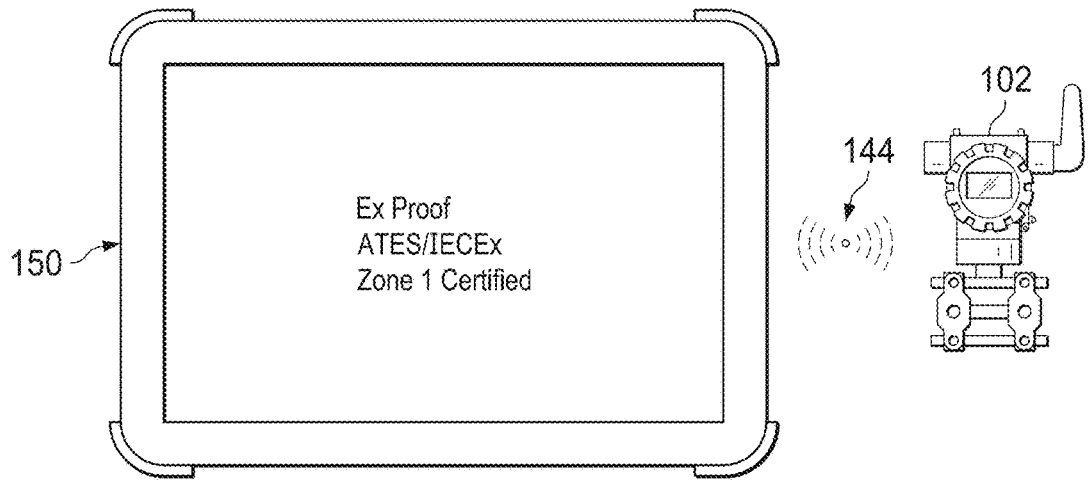

FIG. 3 illustrates an example of the multimeter 150 operating as a gateway in gateway mode, according to this disclosure.

As shown in FIG. 3, an executing application 152 configures the multimeter 150 to operate in gateway mode. Such configuration may occur at a startup event of the multimeter 150. The multimeter 150 transmits advertisement messages according to a predetermined configuration or a user configuration. For example, in some aspects of operation, the multimeter 150 is preconfigured to advertise in Subnet ID 1 for ISA100. In other aspects of operation, the application 152 receives a network identifier and common join key from a user. The multimeter 150 transmits ISA100 or WirelessHART advertisement messages for the given network identifier. If one or more listening devices (e.g., a field device 102) requests to join the network, the multimeter 150 accepts the device(s) and allows the device(s) to join the network. The multimeter 150 then displays the joining device(s) on the touchscreen 208, along with corresponding signal strength information, such as RSSI, RSQI, and the like. Thus, in gateway mode, the multimeter 150 can be implemented as a simple network management tool to a complex gateway.

Figure 4:
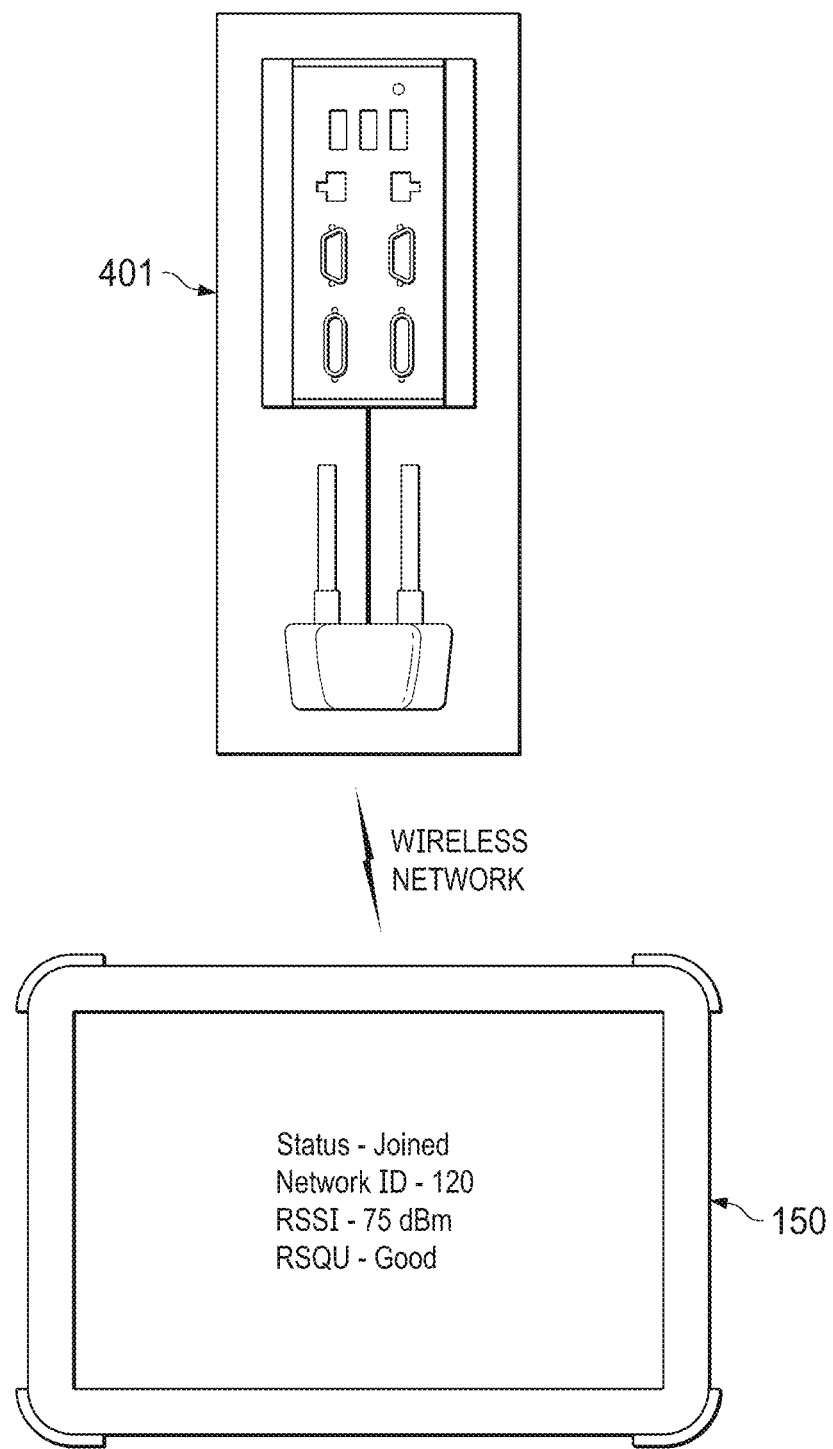
FIG. 4 illustrates an example of a multimeter operating as a field router according to this disclosure.

FIG. 4 illustrates an example of the multimeter 150 operating as a field router in router mode, according to this disclosure.

As shown in FIG. 4, the multimeter 150 executes an application 152 and receives a network identifier and common join key from a user. Using the network identifier and common join key, the multimeter 150 listens for advertisements from one or more access points 401 in the vicinity of the multimeter 150. The access point(s) 401 may be component(s) of the system 100 of FIG. 1.

If the multimeter 150 detects an advertisement from an access point 401, the multimeter 150 can join the network of the access point 401 as a battery powered router. The multimeter 150 then displays information about the joined network, including signal strength, network status, signal quality, router ID, and the like. In some embodiments, the multimeter 150 can sniff multiple networks and display multiple router signal strengths present in the network in a rolling fashion.

Figure 5:
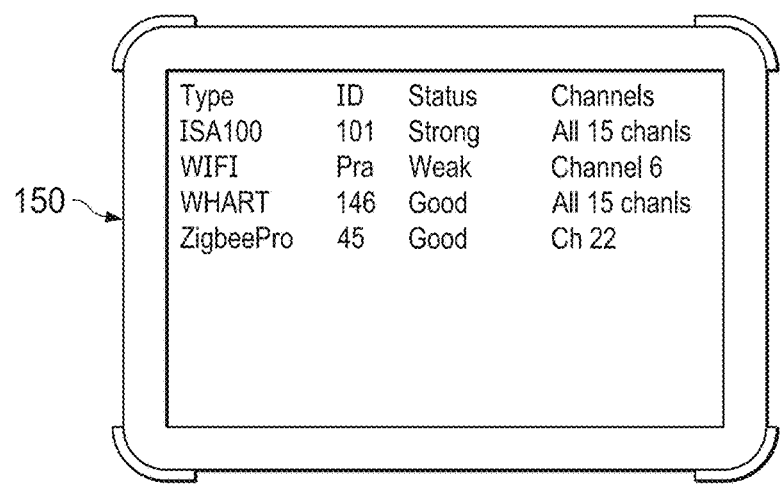
FIG. 5 illustrates an example of a multimeter operating as a sniffer tool according to this disclosure.

FIG. 5 illustrates an example of the multimeter 150 operating as a sniffer tool in sniffer mode, according to this disclosure.

As shown in FIG. 5, the multimeter 150 can sniff for all ISA100, WirelessHART, Zigbee, and WiFi networks in the vicinity of the multimeter 150. For each sniffed network, the multimeter 150 can display the network type, network ID, network status, channel usage, and the like. The multimeter 150 allows a user to input a particular network type (e.g., ISA100, WirelessHART, Zigbee, etc.) or network ID in order to filter results or perform a targeted sniffing operation.

In some embodiments, the WiFi radio of the tablet 202 is used to sniff WiFi networks, while the BLE enabled radio module 204 is used to sniff other types of networks, such as ISA100, Zigbee, and WirelessHART. This is very useful to find existing networks of different network types installed in any location.

Figure 6:
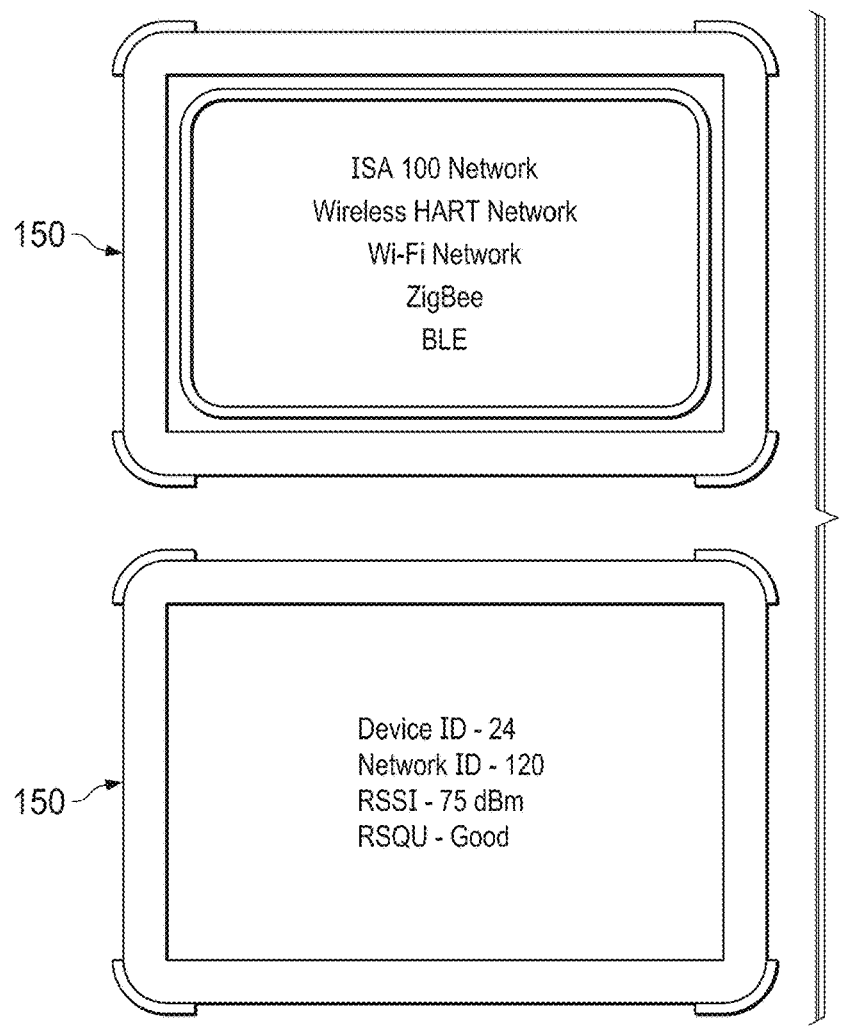
FIG. 6 illustrates an example of a multimeter operating as a discovery tool according to this disclosure.

FIG. 6 illustrates an example of the multimeter 150 operating as a discovery tool in discovery mode, according to this disclosure. The discovery mode is similar to the router mode described in FIG. 4, except that in discovery mode, the multimeter 150 does not join the network.

As shown in FIG. 6, the multimeter 150 executes an application 152 and receives from a user a network identifier and network type (e.g., ISA100, WirelessHART, Zigbee, etc.) to discover. Using the network identifier and network type, the multimeter 150 sniffs for packets of that network. This is done by listening on all 802.15.4 channels of the user-selected network for a predefined period of time. The multimeter 150 lists all devices on the network that are visible to the multimeter 150. The multimeter 150 displays the devices with associated network parameters, such as network address, RSSI, RSQI, and the like.

One difference between the router mode and the discovery mode is that, in the router mode, the multimeter 150 discovers network routers faster since the multimeter 150 joins the network and understands the pattern of the advertising messages.

Figure 7A:
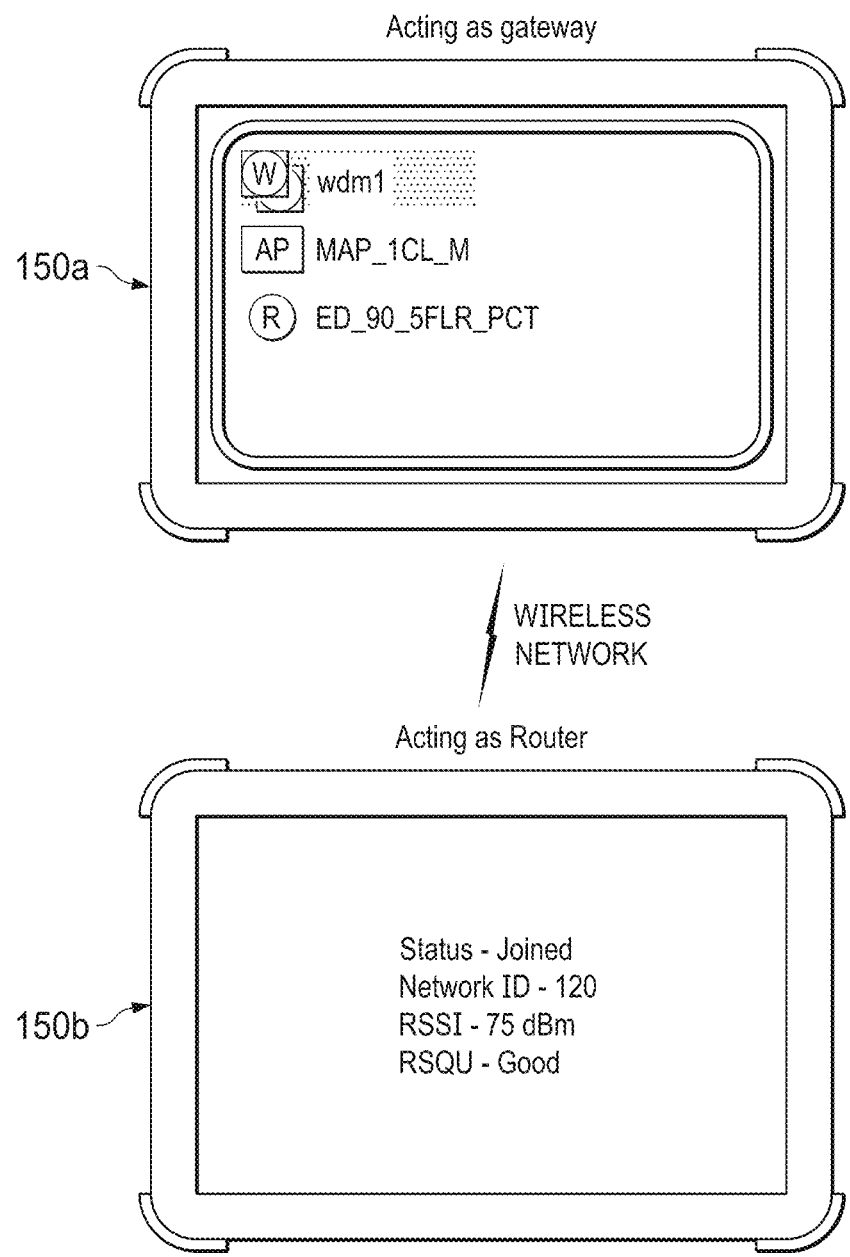
FIGS. 7A and 7B illustrate an example system for performing a site survey using two multimeters according to this disclosure.
Figure 7B:
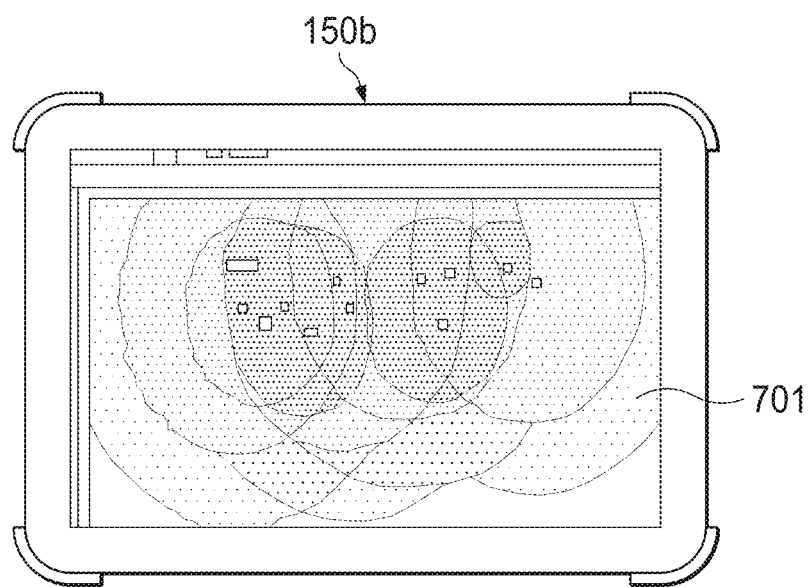

FIGS. 7A and 7B illustrate an example system for performing a site survey using two multimeters 150 according to this disclosure. As shown in FIG. 7A, the system includes two multimeters 150: a first multimeter 150a operating in gateway mode, and a second multimeter 150b operating in router mode.

To perform the site survey, the access point(s) and WDM are placed and mounted at their determined locations. Then, the first multimeter 150a (in the gateway mode) is positioned at or near a location where an access point or gateway are mounted. Then, the second multimeter 150b (in the router mode) is carried or moved to each of the proposed install locations where a field device is to be installed. The second multimeter 150b is allowed to join the WDM, and once it is joined, information about the network connection (e.g., signal strength, RSSI) is displayed on the touchscreen of the multimeter 150b. A user reviews the information on the screen to determine if the proposed location for the field instrument will enable a suitable network connection. If the proposed location is not suitable, then the first multimeter 150a, the second multimeter 150b, or both can be moved to a different location to determine if the connection improves. As shown in FIG. 7B, a "heat map" 701 showing signal strength by color can be generated and displayed on the second multimeter 150b based on live data received from the first multimeter 150a. The heat map 701 indicates whether a location is good for installation using at least two router paths.

The information shown on the touchscreen of the second multimeter 150b helps the user to complete a site survey quickly, easily, and more accurately. Using this method, a user no longer has to carry heavy field devices from location to location during the site survey.

Figure 8:
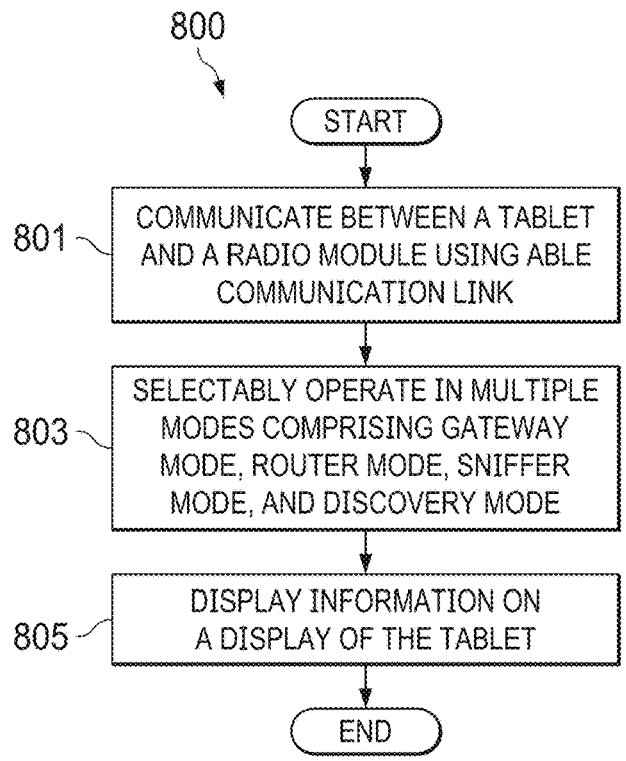
FIG. 8 illustrates an example method for using a multimeter in an industrial process control system according to this disclosure.

FIG. 8 illustrates an example method 800 for using a multimeter in an industrial process control system according to this disclosure. For ease of explanation, the method 800 is described as being performed using the multimeter 150. However, the method 800 could be used with any suitable device, system, or application.

At step 801, a tablet computing device and a radio module of an apparatus communicate using a BLE communication link. The tablet computing device is configured to establish WiFi and BLE communication links with other devices. The radio module is physically fastened to the tablet computing device and is configured to establish ISA100 and WirelessHART communication links with field devices of a process control and automation system. This may include, for example, the tablet 202 and the radio module 204 communicating using BLE as part of the multimeter 150.

At step 803, the apparatus selectably operates in multiple modes including a gateway mode, a router mode, a sniffer mode, and a discovery mode. This may include, for example, the multimeter 150 operating in any of these modes.

In the gateway mode, the apparatus transmit advertisement messages over a ISA100 communication link or a WirelessHART communication link to one or more field devices, receives a request from at least one first field device to join a network associated with the apparatus, and displays information about the field device on the display of the tablet computing device. In the router mode, the apparatus transmits advertisement messages over a ISA100 communication link or a WirelessHART communication link to one or more field devices, and receives a request from at least one first field device to join a network associated with the apparatus, and displays information about the field device on the display of the tablet computing device.

In the sniffer mode, the apparatus sniffs a plurality of network channels to identify one or more networks surrounding the apparatus, and displays information about each of the one or more networks surrounding the apparatus on the display of the tablet computing device. In the discovery mode, the apparatus sniffs one or more network channels of a predetermined network to identify one or more devices connected to the predetermined network, and displays information about the one or more devices on the display of the tablet computing device.

At operation 805, information is displayed on the display of the tablet computing device for viewing by a user. This may include, for example, displaying information on the touchscreen 208.

Although FIG. 8 illustrates one example of a method 800 for using a multimeter, various changes may be made to FIG. 8. For example, while shown as a series of steps, various steps shown in FIG. 8 could overlap, occur in parallel, occur in a different order, or occur multiple times. Moreover, some steps could be combined or removed and additional steps could be added according to particular needs.

Figure 9:
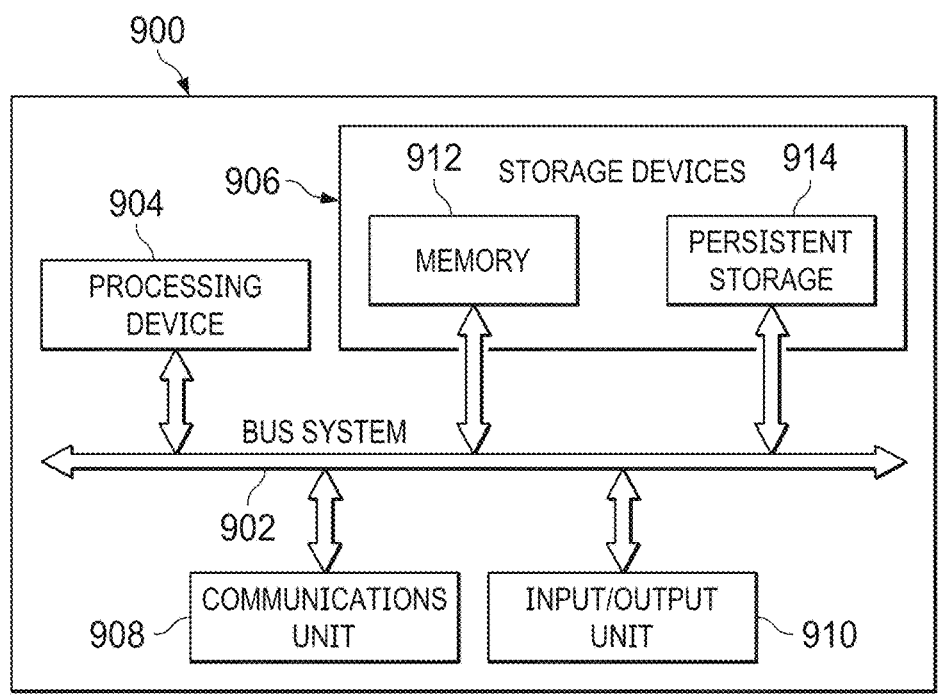
FIG. 9 illustrates an example device for easy deployment, troubleshooting, and maintenance of field devices in an industrial process control system according to this disclosure.

FIG. 9 illustrates an example device 900 for easy deployment, troubleshooting, and maintenance of field devices in an industrial process control system according to this disclosure. The device 900 could, for example, represent the multimeter 150. The device 900 could represent any other suitable device for easy deployment, troubleshooting, and maintenance of field devices in a process control system.

As shown in FIG. 9, the device 900 can include a bus system 902, which supports communication between at least one processing device 904, at least one storage device 906, at least one communications unit 908, and at least one input/output (I/O) unit 910. The processing device 904 executes instructions that may be loaded into a memory 912. The processing device 904 may include any suitable number(s) and type(s) of processors or other devices in any suitable arrangement. Example types of processing devices 904 include microprocessors, microcontrollers, digital signal processors, field programmable gate arrays, application specific integrated circuits, and discrete circuitry.

The memory 912 and a persistent storage 914 are examples of storage devices 906, which represent any structure(s) capable of storing and facilitating retrieval of information (such as data, program code, and/or other suitable information on a temporary or permanent basis). The memory 912 may represent a random access memory or any other suitable volatile or non-volatile storage device(s). The persistent storage 914 may contain one or more components or devices supporting longer-term storage of data, such as a ready only memory, hard drive, Flash memory, or optical disc. In accordance with this disclosure, the memory 912 and the persistent storage 914 may be configured to store instructions associated with a mobile application for easy deployment, troubleshooting, and maintenance of field devices in a process control system.

The communications unit 908 supports communications with other systems, devices, or networks, such as the field devices 102. For example, the communications unit 908 could include a network interface that facilitates communications over at least one Ethernet network. The communications unit 908 could also include a wireless transceiver facilitating communications over at least one wireless network. The communications unit 908 may support communications through any suitable physical or wireless communication link(s) and using any suitable communication protocol(s) (e.g., BLE, WirelessHART, etc.).

The I/O unit 910 allows for input and output of data. For example, the I/O unit 910 may provide a connection for user input through a keyboard, mouse, keypad, touchscreen, or other suitable input device. The I/O unit 910 may also send output to a display, printer, or other suitable output device.

Although FIG. 9 illustrates one example of a device 900 for easy deployment, troubleshooting, and maintenance of field devices in a process control system, various changes may be made to FIG. 9. For example, various components in FIG. 9 could be combined, further subdivided, or omitted and additional components could be added according to particular needs. Also, computing and communication devices can come in a wide variety of configurations, and FIG. 9 does not limit this disclosure to any particular configuration of device.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system, or part thereof that controls at least one operation. A controller may be implemented in hardware or a combination of hardware and software/firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus arranged as a wireless multimeter for use in an industrial control system comprising:
    a tablet computing device having a display and configured to establish WiFi and BLUETOOTH Low Energy (BLE) communication links with other devices; and
    a radio module physically fastened to the tablet computing device and configured to establish ISA100 and WirelessHART communication links with field devices of a process control and automation system, wherein the tablet and the radio module communicate using BLE as part of the multimeter,
    wherein the tablet computing device and the radio module are configured to communicate with each other using a BLE communication link,
    wherein the apparatus is configured to operate in a gateway mode,
    wherein the tablet computing device is configured to store and execute one or more applications and at least one of the applications communicates with and configures the radio module using the BLE communication link, and the wireless multimeter executing the one or more applications for at least one of setting up, expanding, or troubleshooting industrial wireless networks in the process control and automation system, and
    wherein the apparatus is configured to wirelessly communicate with a second apparatus operating in a router mode to perform a site survey of the strength of wireless signals at a remote location, the apparatus establishing a network connection to a network comprising field devices and at least one access point and the second apparatus moved to the remote location and allowed to join the network, the second apparatus receiving the strength of the wireless network signal at the remote location.

2. The apparatus of claim 1, wherein in the gateway mode, the apparatus is configured to:

transmit advertisement messages over a ISA100 communication link or a WirelessHART communication link to one or more field devices;

receive a request from at least one first field device to join a network associated with the apparatus; and display information about the field device on the display of the tablet computing device.

3. The apparatus of claim 1, wherein the apparatus is further configured to selectably operate in multiple modes comprising the gateway mode, a router mode, a sniffer mode, and a discovery mode, wherein in the router mode, the apparatus is configured to:

transmit advertisement messages over a ISA100 communication link or a WirelessHART communication link to one or more field devices;

receive a request from at least one first field device to join a network associated with the apparatus; and display information about the field device on the display of the tablet computing device.

4. The apparatus of claim 3, wherein in the sniffer mode, the apparatus is configured to:

sniff a plurality of network channels to identify one or more networks surrounding the apparatus; and display information about each of the one or more networks surrounding the apparatus on the display of the tablet computing device.

5. The apparatus of claim 3, wherein in the discovery mode, the apparatus is configured to:

sniff one or more network channels of a predetermined network to identify one or more devices connected to the predetermined network; and display information about the one or more devices on the display of the tablet computing device.

6. The apparatus of claim 1, wherein the display of the tablet computing device comprises a touchscreen.

7. A method to provide a wireless multimeter for use in an industrial control system comprising:

communicating between a tablet computing device and a radio module of an apparatus using a BLUETOOTH Low Energy (BLE) communication link;

operating, the apparatus, in a gateway mode; and displaying information on a display of the tablet computing device, wherein the tablet computing device is configured to establish WiFi and BLE communication links with other devices, and wherein the radio module is physically fastened to the tablet computing device and is configured to establish ISA100 and WirelessHART communication links with field devices of a process control and automation system, wherein the tablet and the radio module communicate using BLE as part of the multimeter, wherein the tablet computing device is configured to store and execute one or more applications and at least one of the applications communicates with and configures the radio module using the BLE communication link, and the wireless multimeter executing the one or more applications for at least one of setting up, expanding, or troubleshooting industrial wireless networks in the process control and automation system, and wherein the apparatus is configured to wirelessly communicate with a second apparatus operating in a router mode to perform a site survey of the strength of wireless signals at a remote location, the apparatus establishing a network connection to a network comprising field devices and at least one access point and the second apparatus moved to the remote location and allowed to join the network, the second apparatus receiving the strength of the wireless network signal at the remote location.

8. The method of claim 7, wherein operating in the gateway mode comprises:

transmitting advertisement messages over a ISA100 communication link or a WirelessHART communication link to one or more field devices;

receiving a request from at least one first field device to join a network associated with the apparatus; and displaying information about the field device on the display of the tablet computing device.

9. The method of claim 7, selectably operating the apparatus in multiple modes comprising the gateway mode, a router mode, a sniffer mode, and a discovery mode, wherein operating in the router mode comprises:

detecting one or more advertisement messages from an access point;

joining a network associated with the access point; and displaying information about the network on the display of the tablet computing device.

10. The method of claim 9, wherein operating in the sniffer mode comprises:

sniffing a plurality of network channels to identify one or more networks surrounding the apparatus; and displaying information about each of the one or more networks surrounding the apparatus on the display of the tablet computing device.

11. The method of claim 9, wherein operating in the discovery mode comprises:

sniffing one or more network channels of a predetermined network to identify one or more devices connected to the predetermined network; and displaying information about the one or more devices on the display of the tablet computing device.

12. The method of claim 7, wherein the display of the tablet computing device comprises a touchscreen.

13. A non-transitory computer readable medium containing instructions that, when executed by at least one processing device provides a wireless multimeter for use in an industrial control system, causing the at least one processing device to:

control a tablet computing device and a radio module of an apparatus to communicate using a BLUETOOTH Low Energy (BLE) communication link;

operate the apparatus in a gateway mode; and display information on a display of the tablet computing device, wherein the tablet computing device is configured to establish WiFi and BLE communication links with other devices, and wherein the radio module is physically fastened to the tablet computing device and is configured to establish ISA100 and WirelessHART communication links with field devices of a process control and automation system, wherein the tablet and the radio module communicate using BLE as part of the multimeter, wherein the tablet computing device is configured to store and execute one or more applications and at least one of the applications communicates with and configures the radio module using the BLE communication link, and the wireless multimeter executing the one or more applications for at least one of setting up, expanding, or troubleshooting industrial wireless networks in the process control and automation system, and wherein the apparatus is configured to wirelessly communicate with a second apparatus operating in a router mode to perform a site survey of the strength of wireless signals at a remote location, the apparatus establishing a network connection to a network comprising field devices and at least one access point and the second apparatus moved to the remote location and allowed to join the network, the second apparatus receiving the strength of the wireless network signal at the remote location.

14. The non-transitory computer readable medium of claim 13, wherein the instructions to operate the apparatus in the gateway mode comprise instructions to:
   transmit advertisement messages over a ISA100 communication link or a WirelessHART communication link to one or more field devices;
   receive a request from at least one first field device to join a network associated with the apparatus; and
   display information about the field device on the display of the tablet computing device.

15. The non-transitory computer readable medium of claim 13, wherein the instructions selectably operate, by the apparatus, in multiple modes comprising the gateway mode, a router mode, a sniffer mode, and a discovery mode, wherein the instructions to operate the apparatus in the router mode comprise instructions to:
   detect one or more advertisement messages from an access point;
   join a network associated with the access point; and
   display information about the network on the display of the tablet computing device.

16. The non-transitory computer readable medium of claim 15, wherein the instructions to operate the apparatus in the sniffer mode comprise instructions to:
   sniff a plurality of network channels to identify one or more networks surrounding the apparatus; and
   display information about each of the one or more networks surrounding the apparatus on the display of the tablet computing device.

17. The non-transitory computer readable medium of claim 15, wherein the instructions to operate the apparatus in the discovery mode comprise instructions to:
   sniff one or more network channels of a predetermined network to identify one or more devices connected to the predetermined network; and
   display information about the one or more devices on the display of the tablet computing device.

* * * * *